United States Patent
Kimoto

(10) Patent No.: US 9,761,743 B2
(45) Date of Patent: Sep. 12, 2017

(54) PHOTOELECTRIC CONVERSION ELEMENT

(71) Applicant: Sharp Kabushiki Kaisha, Osaka-shi, Osaka (JP)

(72) Inventor: Kenji Kimoto, Osaka (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 14/764,224

(22) PCT Filed: Mar. 27, 2014

(86) PCT No.: PCT/JP2014/058870
§ 371 (c)(1),
(2) Date: Jul. 29, 2015

(87) PCT Pub. No.: WO2014/157521
PCT Pub. Date: Oct. 2, 2014

(65) Prior Publication Data
US 2015/0364624 A1 Dec. 17, 2015

(30) Foreign Application Priority Data
Mar. 28, 2013 (JP) .................. 2013-069746

(51) Int. Cl.
*H01L 31/0224* (2006.01)
*H01L 31/0376* (2006.01)
(Continued)

(52) U.S. Cl.
CPC ........... *H01L 31/022433* (2013.01); *H01L 31/03762* (2013.01); *H01L 31/075* (2013.01); *H01L 31/0747* (2013.01); *Y02E 10/50* (2013.01)

(58) Field of Classification Search
CPC ....... H01L 31/022441; H01L 31/03529; H01L 31/0682; H01L 31/0747; H01L 31/075; Y02E 10/547
See application file for complete search history.

(56) References Cited

U.S. PATENT DOCUMENTS

2002/0182801 A1* 12/2002 Shimazaki .......... H01L 27/0623
438/234
2005/0062041 A1  3/2005 Terakawa et al.
(Continued)

FOREIGN PATENT DOCUMENTS

CN       1601759 A     3/2005
CN     101401215 A     4/2009
(Continued)

OTHER PUBLICATIONS

Official Communication issued in International Patent Application No. PCT/JP2014/058870, mailed on Apr. 22, 2014.

*Primary Examiner* — Susan D Leong
(74) *Attorney, Agent, or Firm* — Keating & Bennett, LLP

(57) ABSTRACT

A photoelectric conversion element includes an intrinsic layer that is disposed on a semiconductor of a first conductivity type and contains hydrogenated amorphous silicon; and a first-conductivity-type layer containing hydrogenated amorphous silicon of the first conductivity type, a second-conductivity-type layer containing hydrogenated amorphous silicon of a second conductivity type, and an insulating layer, each of which covers a part of the intrinsic layer. A first electrode is disposed on the first-conductivity-type layer with the second-conductivity-type layer therebetween. At least a part of the first electrode is located above a region where the first-conductivity-type layer contacts the intrinsic layer, and at least a part of the second electrode is located above a region where the second-conductivity-type layer contacts the intrinsic layer.

14 Claims, 17 Drawing Sheets

(51) Int. Cl.
*H01L 31/06* (2012.01)
*H01L 31/072* (2012.01)
*H01L 31/0747* (2012.01)
*H01L 31/075* (2012.01)

(56) References Cited

U.S. PATENT DOCUMENTS

| | | |
|---|---|---|
| 2007/0169808 A1 | 7/2007 | Kherani et al. |
| 2012/0012179 A1 | 1/2012 | Asaumi et al. |
| 2012/0037227 A1 | 2/2012 | Takahama et al. |
| 2012/0090674 A1 | 4/2012 | Takahama et al. |
| 2013/0186456 A1 | 7/2013 | Ide et al. |
| 2013/0247970 A1 | 9/2013 | Morigami et al. |

FOREIGN PATENT DOCUMENTS

| | | | |
|---|---|---|---|
| CN | 102349166 A | 2/2012 | |
| CN | 102369601 A | 3/2012 | |
| CN | 102422434 A | 4/2012 | |
| CN | 102725858 A | 10/2012 | |
| EP | 2 541 617 A1 | 1/2013 | |
| JP | 2009-524916 A | 7/2009 | |
| SG | GB 2503513 A * | 1/2014 | ..... H01L 31/022441 |
| WO | 2010/113750 A1 | 10/2010 | |
| WO | WO2011093329 A1 * | 8/2011 | |
| WO | 2011/105554 A1 | 9/2011 | |

* cited by examiner (a)

(b)

PHOTOELECTRIC CONVERSION ELEMENT

TECHNICAL FIELD

The present invention relates to photoelectric conversion elements.

BACKGROUND ART

Solar cells that directly convert solar energy to electrical energy have been the subject of rapidly increasing expectations in recent years as next-generation energy sources from the global environmental viewpoint. Solar cells come in a wide variety of types including those that use compound semiconductors or organic materials. Currently, the mainstream solar cells are those which use silicon crystals.

Solar cells that are currently produced and sold in the largest quantity are those which have electrodes formed on a front surface, which is a surface on which the sunlight is incident, and electrodes formed on a back surface opposite the front surface.

However, forming electrodes on the front surface decreases the amount of incident sunlight by an amount corresponding to the area occupied by the electrodes that reflect and absorb the sunlight. Accordingly, development of solar cells in which electrodes are formed on back surfaces is in progress (for example, refer to Japanese Unexamined Patent Application Publication (Translation of PCT Application) No. 2009-524916 (PTL 1)).

FIG. 21 is a schematic cross-sectional view of an amorphous/crystalline silicon heterojunction device described in PTL 1. As illustrated in FIG. 21, in the amorphous/crystalline silicon heterojunction device described in PTL 1, an intrinsic hydrogenated amorphous silicon transition layer 102 is formed on a back surface of a crystalline silicon wafer 101, an n-doped region 103 and a p-doped region 104 of hydrogenated amorphous silicon are formed on the intrinsic hydrogenated amorphous silicon transition layer 102, electrodes 105 are formed on the n-doped region 103 and the p-doped region 104, and an insulating reflection layer 106 is formed between the electrodes 105.

In the amorphous/crystalline silicon heterojunction device described in PTL 1 illustrated in FIG. 21, the n-doped region 103 and the p-doped region 104 are formed by lithography and/or a shadow masking process (for example, refer to paragraph 0020 and the like of PTL 1).

CITATION LIST

Patent Literature

[PTL 1] Japanese Unexamined Patent Application Publication (Translation of PCT Application) No. 2009-524916

SUMMARY OF INVENTION

Technical Problem

In order to form an n-doped region 103 and a p-doped region 104 by lithography, the n-doped region 103 and the p-doped region 104 need to be etched by a process that can increase the etching selectivity ratios of the n-doped region 103 and the p-doped region 104 relative to the intrinsic hydrogenated amorphous silicon transition layer 102. However, PTL 1 is silent as to such an etching process that can increase the etching selectivity ratios.

Since the thickness of the laminate constituted by the intrinsic hydrogenated amorphous silicon transition layer 102 and the n-doped region 103 and the thickness of the laminate constituted by the intrinsic hydrogenated amorphous silicon transition layer 102 and the p-doped region 104 are few angstroms to several tens of nanometers (refer to paragraph 0018 of PTL 1), the thickness of the intrinsic hydrogenated amorphous silicon transition layer 102 is very small. It is extremely difficult to etch the n-doped region 103 and the p-doped region 104 while leaving such a thin intrinsic hydrogenated amorphous silicon transition layer 102 unetched.

In the case where an n-doped region 103 and a p-doped region 104 are formed by a shadow masking process, patterning accuracy is significantly degraded because during formation of the n-doped region 103 and the p-doped region 104 by a plasma CVD (chemical vapor deposition) method, gas reaching behind the mask renders it difficult to separate between the n-doped region 103 and the p-doped region 104; thus, the space between the n-doped region 103 and the p-doped region 104 needs to be large. However, widening the space between the n-doped region 103 and the p-doped region 104 increases the area that does not have the n-doped region 103 or the p-doped region 104, and thus decreases the conversion efficiency of the amorphous/crystalline silicon heterojunction device.

Under the above-described circumstances, an object of the present invention is to provide a photoelectric conversion element that can be manufactured in high yield and has enhanced properties.

Solution to Problem

The present invention provides a photoelectric conversion element that includes a semiconductor of a first conductivity type; an intrinsic layer disposed on the semiconductor and containing hydrogenated amorphous silicon; a first-conductivity-type layer covering a part of the intrinsic layer and containing hydrogenated amorphous silicon of the first conductivity type; a second-conductivity-type layer covering a part of the intrinsic layer and containing hydrogenated amorphous silicon of a second conductivity type; an insulating layer covering a part of the intrinsic layer; a first electrode disposed on the first-conductivity-type layer; and a second electrode disposed on the second-conductivity-type layer. The first electrode is disposed on the first-conductivity-type layer with the second-conductivity-type layer therebetween. At least a part of the first electrode is located above a region where the first-conductivity-type layer contacts the intrinsic layer, and at least a part of the second electrode is located above a region where the second-conductivity-type layer contacts the intrinsic layer. According to this structure, patterning of the first-conductivity-type layer can be conducted over the insulating layer and thus damage on the semiconductor and the intrinsic layer inflicted during patterning of the n-type layer can be decreased. As a result, the heterojunction-type back-contact cell can be manufactured in high yield, and properties thereof can be enhanced. Since there is no need to conduct patterning of the second-conductivity-type layer in order to make this structure, the process of manufacturing the heterojunction-type back-contact cell can be simplified.

Advantageous Effects of Invention

According to the present invention, a photoelectric conversion element that can be manufactured in high yield and has enhanced properties can be provided.

DESCRIPTION OF EMBODIMENTS

Figure 1:
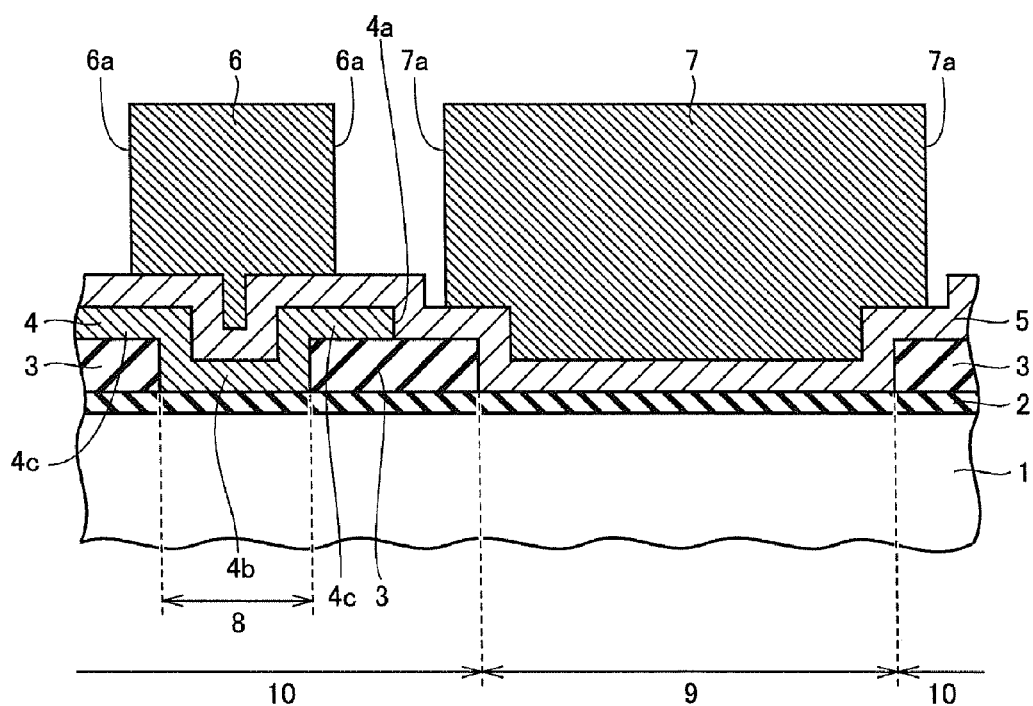
FIG. 1 is a schematic cross-sectional view of a heterojunction-type back-contact cell of Embodiment 1.

Embodiments of the present invention will now be described. In the drawings illustrating the present invention, the same reference signs denote the same or corresponding parts.

Embodiment 1

FIG. 1 is a schematic cross-sectional view of a heterojunction-type back-contact cell according to Embodiment 1 which is an example of a photoelectric conversion element according to the present invention. The heterojunction-type back-contact cell according to Embodiment 1 includes a semiconductor 1 composed of n-type single-crystal silicon, an intrinsic layer 2 that covers the entire back surface of the semiconductor 1 and contains i-type hydrogenated amorphous silicon, an n-type layer 4 that covers a part of the back surface of the intrinsic layer 2 and contains n-type hydrogenated amorphous silicon, a p-type layer 5 that covers a part of the back surface of the intrinsic layer 2 and contains p-type hydrogenated amorphous silicon, and an insulating layer 3 that covers a part of the back surface of the intrinsic layer 2. The n-type layer 4, the p-type layer 5, and the insulating layer 3 respectively cover different regions of the back surface of the semiconductor 1.

The insulating layer 3 has a strip shape. The n-type layer 4 is formed to have a shape that has a groove portion 4b whose recess portion extends in a straight line in a direction normal to the plane of paper of FIG. 1, and a flap portion 4c that extends from upper edges of both side walls of the groove portion 4b toward outside of the groove portion 4b. The p-type layer 5 is formed into a shape that covers the entire back-surface-side of the intrinsic layer 2 in which the insulating layer 3 and the n-type layer 4 are formed. In other words, the p-type layer 5 directly covers the back surface of the intrinsic layer 2 in a region 9 where the p-type layer 5 contacts the intrinsic layer 2. Meanwhile, in a region 10 other than the region 9 where the p-type layer 5 contacts the intrinsic layer 2, the p-type layer 5 indirectly covers the intrinsic layer 2 with at least one of the insulating layer 3 and the n-type layer 4 therebetween.

A part of the back surface of the insulating layer 3 is covered with the flap portion 4c of the n-type layer 4. Another part of the back surface of the insulating layer 3 is covered with the p-type layer 5. The back surface and an end portion 4a of the n-type layer 4 are covered with the p-type layer 5. The end portion 4a of the n-type layer 4 is an outer side face of the flap portion 4c of the n-type layer 4. The end portion 4a of the n-type layer 4 is located on the back surface of the insulating layer 3.

A first electrode 6 is disposed on the p-type layer 5 located on the n-type layer 4. Thus, the first electrode 6 is disposed on the n-type layer 4 with the p-type layer 5 therebetween. At least part of the first electrode 6 is located above a region 8 where the intrinsic layer 2 contacts the n-type layer 4.

A second electrode 7 is disposed on the p-type layer 5. At least part of the second electrode 7 is located above the region 9 where the intrinsic layer 2 contacts the p-type layer 5.

The first electrode 6 and the second electrode 7 also each have a shape that extends in a straight line in a direction normal to the plane of the paper of FIG. 1 as with the insulating layer 3, the n-type layer 4, and the p-type layer 5. An end portion 6a, which is an end face in a direction perpendicular to the direction in which the first electrode 6 extends, and an end portion 7a, which is an end face in a direction perpendicular to the direction in which the second electrode 7 extends, are located on the p-type layer 5 on the insulating layer 3.

The back-surface-side structure of the semiconductor 1 has the structure described above. A texture structure and/or an antireflection film that also serves as a passivation film may be formed on a front surface of the semiconductor 1 opposite the back surface. The antireflection film may be a laminate film in which an antireflection layer is formed on a passivation layer.

Figure 2:
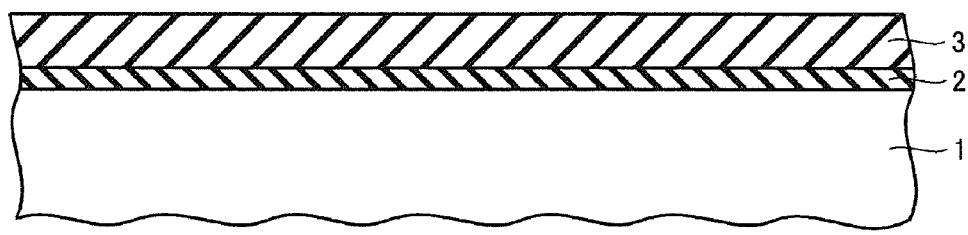
FIG. 2 is a schematic cross-sectional view illustrating an example of a method for manufacturing the heterojunction-type back-contact cell of Embodiment 1.

An example of a method for manufacturing a heterojunction-type back-contact cell of Embodiment 1 will now be described with reference to schematic cross-sectional views of FIGS. 2 to 7. First, as illustrated in FIG. 2, after an intrinsic layer 2 composed of i-type hydrogenated amorphous silicon is deposited by, for example, a plasma CVD method on the entire back surface of a semiconductor 1 subjected to an RCA washing, an insulating layer 3 is formed on the entire back surface of the intrinsic layer 2 by, for example, a plasma CVD method. A texture structure and/or an antireflection film that also serves as a passivation film may also be formed on a front surface of the semiconductor 1 as described above. For the purposes of this specification, "i-type" means an intrinsic semiconductor.

The semiconductor 1 is not limited to n-type single-crystal silicon. For example, a known semiconductor may be used. The thickness of the semiconductor 1 is not particularly limited and can be, for example, 50 μm or more and 300 μm or less and is preferably 70 μm or more and 150 μm or less. The resistivity of the semiconductor 1 is also not particularly limited and can be, for example, 0.5 Ω·cm or more and 10 Ω·cm or less.

The texture structure on the front surface of the semiconductor 1 can be formed by, for example, texture-etching the entire front surface of the semiconductor 1.

The antireflection film that also serves as a passivation film of the front surface of the semiconductor 1 may be, for example, a silicon nitride film, a silicon oxide film, a laminate of a silicon nitride film and a silicon oxide film, or the like. The thickness of the antireflection film can be, for example, about 100 nm. The antireflection film can be formed by, for example, a sputtering method or a plasma CVD method.

The thickness of the intrinsic layer 2 formed on the entire back surface of the semiconductor 1 is not particularly limited and may be, for example, 1 nm or more and 10 nm or less. Specifically, the thickness may be about 4 nm.

The insulating layer 3 formed on the entire back surface of the intrinsic layer 2 may be any layer composed of an insulating material. Preferably, the material can be etched substantially without affecting the intrinsic layer 2. The insulating layer 3 may be, for example, a silicon nitride layer, a silicon oxide layer, or a laminate of a silicon nitride layer and a silicon oxide layer formed by a plasma CVD method or the like. In such a case, for example, hydrofluoric acid can be used so as to etch the insulating layer 3 without damaging the intrinsic layer 2. The thickness of the insulating layer 3 is not particularly limited and can be, for example, about 100 nm.

Figure 3:
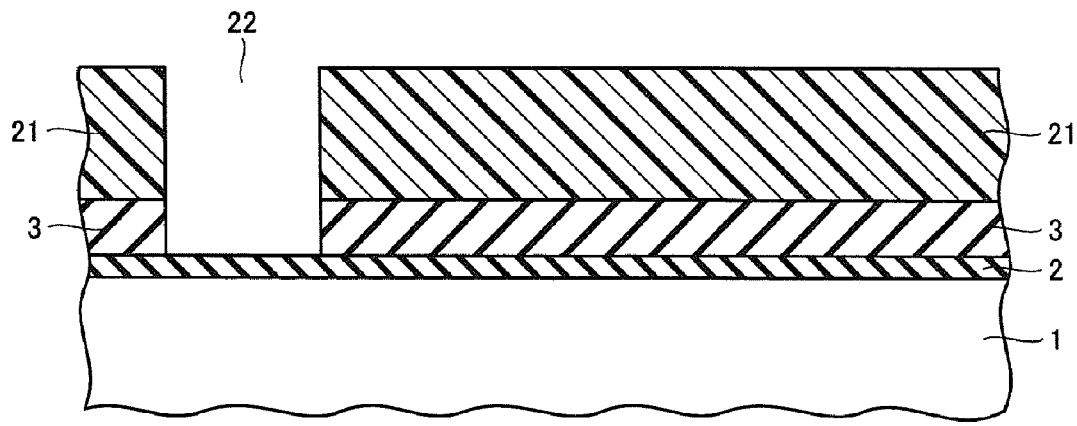
FIG. 3 is a schematic cross-sectional view illustrating an example of a method for manufacturing the heterojunction-type back-contact cell of Embodiment 1.

Next, as illustrated in FIG. 3, a resist 21 having an opening 22 is formed on the back surface of the insulating layer 3. Then a portion of the insulating layer 3 exposed in the opening 22 of the resist 21 is removed to expose the back surface of the intrinsic layer 2 in the opening 22 of the resist 21.

The resist 21 having the opening 22 can be formed by, for example, a photolithographic method, a printing method, or the like. The insulating layer 3 may be removed by wet etching using hydrofluoric acid or the like, etching using an etching paste, or the like. The intrinsic layer 2 composed of i-type hydrogenated amorphous silicon remains substantially unetched by hydrofluoric acid. Thus, from the viewpoint of completely removing the insulating layer 3 exposed in the opening 22 in the thickness direction by using the intrinsic layer 2 as the etching stop layer, the insulating layer 3 is preferably removed by wet etching using hydrofluoric acid.

Figure 4:
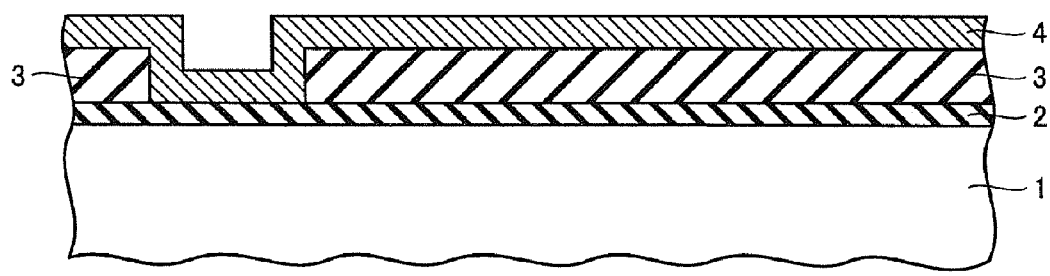
FIG. 4 is a schematic cross-sectional view illustrating an example of a method for manufacturing the heterojunction-type back-contact cell of Embodiment 1.

Subsequently, the resist 21 is completely removed from the back surface of the insulating layer 3. As illustrated in FIG. 4, an n-type layer 4 composed of n-type hydrogenated amorphous silicon is formed by, for example, a plasma CVD method so that the exposed back surface of the intrinsic layer 2 and the insulating layer 3 are covered.

The thickness of the n-type layer 4 that covers the exposed back surface of the intrinsic layer 2 and the insulating layer 3 is not particularly limited and can be, for example, 5 nm or more and 20 nm or less.

The n-type impurity contained in the n-type layer 4 can be, for example, phosphorus and the n-type impurity concentration in the n-type layer 4 can be, for example, about $5 \times 10^{20}$ atoms/cm$^3$.

Figure 5:
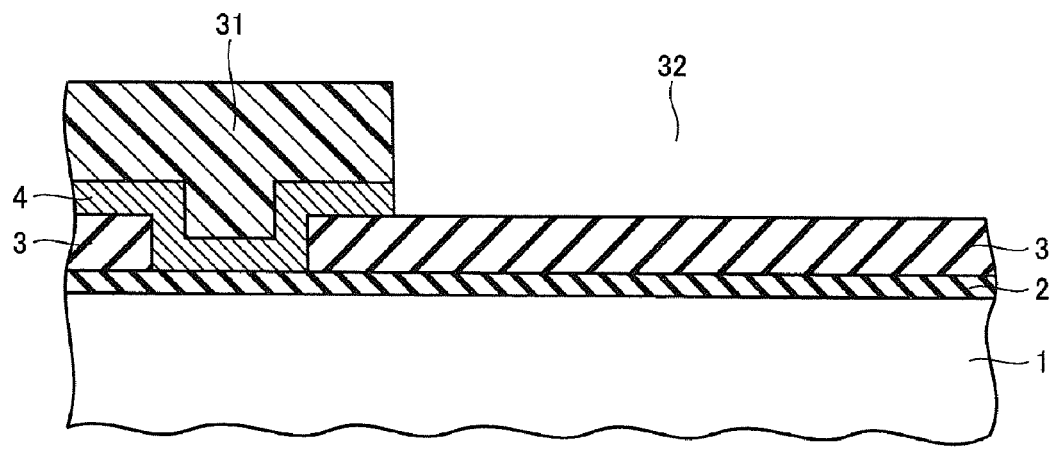
FIG. 5 is a schematic cross-sectional view illustrating an example of a method for manufacturing the heterojunction-type back-contact cell of Embodiment 1.

Next, as illustrated in FIG. 5, a resist 31 having an opening 32 is formed on a part of the back surface of the n-type layer 4. Then a portion of the n-type layer 4 exposed in the opening 32 of the resist 31 is removed so as to expose the back surface of the insulating layer 3 in the opening 32 of the resist 31.

The resist 31 having the opening 32 can be formed by, for example, a photolithographic method, a printing method, or the like. The n-type layer 4 can be selectively removed by, for example, wet etching using an aqueous alkaline solution having a concentration of about 0.1% to 5%, such as an aqueous tetramethylammonium hydroxide solution, an aqueous potassium hydroxide solution, or an aqueous sodium hydroxide solution, without substantially affecting the insulating layer 3.

Figure 6:
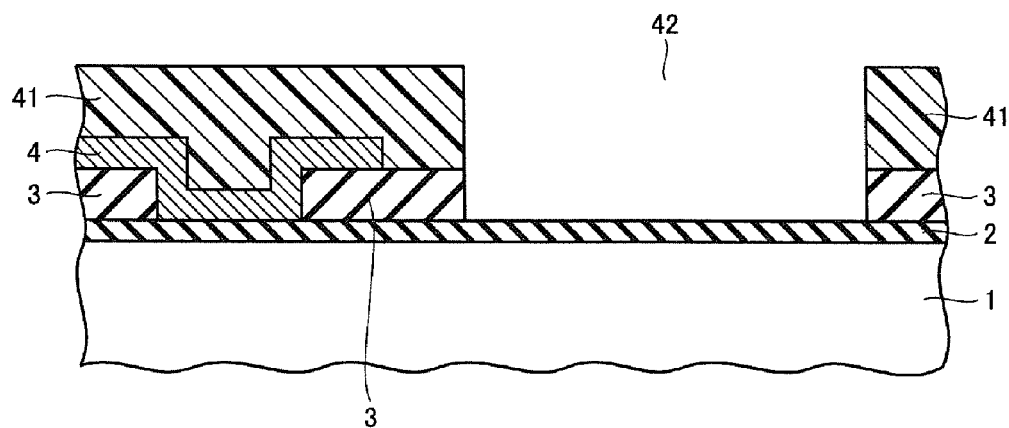
FIG. 6 is a schematic cross-sectional view illustrating an example of a method for manufacturing the heterojunction-type back-contact cell of Embodiment 1.

Next, as illustrated in FIG. 6, a resist 41 having an opening 42 is formed so as to cover the back surface of the insulating layer 3 and the back surface of the n-type layer 4. A portion of the insulating layer 3 exposed in the opening 42 of the resist 41 is removed so as to expose the back surface of the intrinsic layer 2 in the opening 42 of the resist 41.

The resist 41 having the opening 42 can be formed by, for example, a photolithographic method, a printing method, or the like. The insulating layer 3 can be removed by, for example, wet etching using hydrofluoric acid or by etching using an etching paste. For example, in the case where the insulating layer 3 composed of silicon nitride and/or silicon oxide is removed by wet etching using hydrofluoric acid or by etching using an etching paste containing hydrofluoric acid, hydrogenated amorphous silicon is less susceptible to hydrofluoric acid than silicon nitride and silicon oxide, and thus the insulating layer 3 can be selectively removed without substantially affecting the intrinsic layer 2 composed of i-type hydrogenated amorphous silicon.

Figure 7:
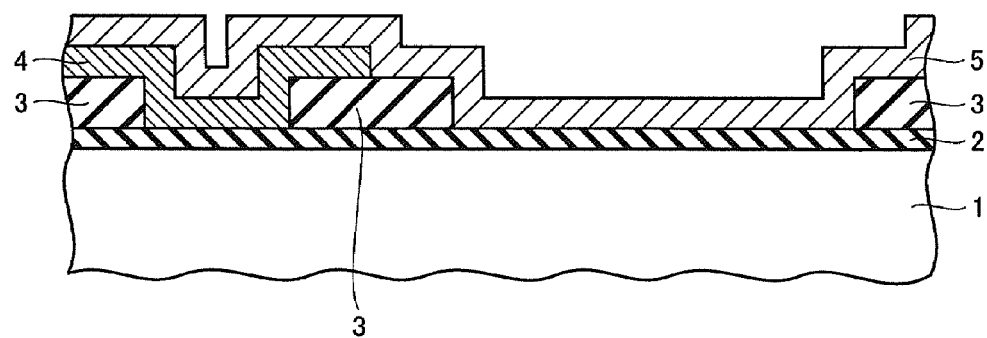
FIG. 7 is a schematic cross-sectional view illustrating an example of a method for manufacturing the heterojunction-type back-contact cell of Embodiment 1.

After the resist 41 is completely removed from the back surface of the insulating layer 3 and the back surface of the n-type layer 4, a p-type layer 5 composed of p-type hydrogenated amorphous silicon is formed by, for example, a plasma CVD method so as to cover the exposed back surface of the intrinsic layer 2 and a laminate constituted by the insulating layer 3 and the n-type layer 4, as illustrated in FIG. 7.

The thickness of the p-type layer 5 is not particularly limited and can be, for example, 5 nm or more and 20 nm or less.

The p-type impurity contained in the p-type layer 5 can be, for example, boron. The p-type impurity concentration in the p-type layer 5 can be, for example, about $5 \times 10^{20}$ atoms/cm$^3$.

Subsequently, as illustrated in FIG. 1, a first electrode 6 is formed on the back surface of the p-type layer 5 on the back surface of the n-type layer 4 and a second electrode 7 is formed on the back surface of the p-type layer 5.

The material for the first electrode 6 and the second electrode 7 is not particularly limited and can be any material that has electrical conductivity. In particular, at least one of aluminum and silver is preferably used. Aluminum and silver have high reflectance for light in the long-wavelength region and thus sensitivity of the semiconductor 1 for light in the long-wavelength region can be improved and the semiconductor 1 can be made thin.

The thickness of the first electrode 6 and the thickness of the second electrode 7 are not particularly limited, and can be, for example, 0.5 µm or more and 10 µm or less.

The method for forming the first electrode 6 and the second electrode 7 is not particularly limited. For example, application and baking of a conductive paste, a vapor deposition method, or the like can be used. A vapor deposition method is preferably used. In the case where the first electrode 6 and the second electrode 7 are formed by a vapor deposition method, the reflectance for light that has passed through the semiconductor 1 can be increased compared to the case where application and baking of a conductive paste are conducted; hence, properties such as short-circuit current density, F.F, and conversion efficiency of the heterojunction-type back-contact cell of Embodiment 1 can be improved.

The heterojunction-type back-contact cell of Embodiment 1 can be manufactured as described above.

As described above, in Embodiment 1, the end portion 4a of the n-type layer 4 is located on the insulating layer 3 and patterning of the n-type layer 4 can be conducted over the insulating layer 3. Thus, damage on the semiconductor 1 and the intrinsic layer 2 inflicted during patterning of then-type layer 4 can be decreased. As a result, in Embodiment 1, a heterojunction-type back-contact cell can be manufactured in high yield and properties thereof can be enhanced.

In Embodiment 1, the first electrode 6 is disposed on the n-type layer 4 with the p-type layer 5 therebetween, and at least part of the first electrode 6 is located above the region 8 where the n-type layer 4 contacts the intrinsic layer 2. At least part of the second electrode 7 is located above the region 9 where the p-type layer 5 contacts the intrinsic layer 2. Accordingly, in Embodiment 1, there is no need to conduct patterning of the p-type layer 5 and thus the process for manufacturing the heterojunction-type back-contact cell can be simplified.

In Embodiment 1, in the region 10 other than the region 9 where the p-type layer 5 contacts the intrinsic layer 2, the p-type layer 5 is located so as to cover the intrinsic layer 2 with at least one of the n-type layer 4 and the insulating layer 3 therebetween. Accordingly, in Embodiment 1, there is no need to conduct patterning of the p-type layer 5 and thus the process for manufacturing the heterojunction-type back-contact cell can be simplified.

In Embodiment 1, the end portion 4a of the n-type layer 4 is located on the insulating layer 3. Accordingly, in Embodiment 1, patterning of the n-type layer 4 can be conducted over the insulating layer 3 and damage on the semiconductor 1 and the intrinsic layer 2 inflicted during patterning of the n-type layer 4 can be decreased. Thus, the heterojunction-type back-contact cell can be manufactured in high yield and properties thereof can be enhanced.

In Embodiment 1, the end portion 6a of the first electrode 6 and the end portion 7a of the second electrode 7 are located above the insulating layer 3. Accordingly, in Embodiment 1, patterning of the first electrode 6 and the second electrode 7 can be conducted over the insulating layer 3, and damage on the semiconductor 1 and the intrinsic layer 2 inflicted during patterning of the first electrode 6 and the second electrode 7 can be decreased. Moreover, in Embodiment 1, the interelectrode distance between the first electrode 6 and the second electrode 7 can be decreased, the amount of light passing through the gap between the first electrode 6 and the second electrode 7 can be decreased, and the amount of light reflecting toward the semiconductor 1 side can be increased. Thus, in Embodiment 1, the heterojunction-type back-contact cell can be manufactured in high yield, and properties thereof can be enhanced.

In Embodiment 1, the end portion 6a of the first electrode 6 and the end portion 7a of the second electrode 7 are located on the p-type layer 5 above the insulating layer 3. Thus, in Embodiment 1, patterning of the first electrode 6 and the second electrode 7 can be conducted over the insulating layer 3, and damage on the semiconductor 1 and the intrinsic layer 2 inflicted during patterning of the first electrode 6 and the second electrode 7 can be decreased. In Embodiment 1, the interelectrode distance between the first electrode 6 and the second electrode 7 can be decreased, the amount of light passing through the gap between the first electrode 6 and the second electrode 7 can be decreased, and the amount of light reflecting toward the semiconductor 1 side can be increased. Thus, in Embodiment 1, the heterojunction-type back-contact cell can be manufactured in high yield, and properties thereof can be enhanced.

In Embodiment 1, the n-type layer 4 preferably has a conductivity of 0.28 S/cm or less. In such a case, in Embodiment 1, the interelectrode distance between the first electrode 6 and the second electrode 7 that are adjacent to and opposing each other (the distance between the end portion 6a of the first electrode 6 and the end portion 7a of the second electrode 7 adjacent to and opposing each other) can be decreased to 10 µm or less. Thus, the amount of light passing through the gap between the first electrode 6 and the second electrode 7 can be decreased, the amount of light reflecting toward the semiconductor 1 side can be increased, and thus properties of the heterojunction-type back-contact cell can be improved.

In Embodiment 1, the second conductivity type is preferably a p-type. According to this structure, the p-type layer 5 can be formed after the n-type layer 4 is formed; thus, a satisfactory passivation effect can be obtained at the back surface of the semiconductor 1 by the intrinsic layer 2. In other words, if the p-type layer 5 is formed before the n-type layer 4 is formed, the passivation properties obtained by the intrinsic layer 2 covered with the p-type layer 5 is degraded by the effect of annealing conducted in forming the n-type layer 4, and effective minor carrier lifetime in the semiconductor 1 may decrease. However, if the p-type layer 5 is formed after the n-type layer 4 is formed, the decrease in effective minor carrier lifetime can be decreased.

In Embodiment 1, a silicon nitride layer and/or a silicon oxide layer formed by a plasma CVD method is preferably used as the insulating layer 3. When a silicon nitride layer and/or a silicon oxide layer formed by a plasma CVD method is used as the insulating layer 3, the etching selectivity ratio by hydrofluoric acid can be increased for the intrinsic layer 2 composed of i-type hydrogenated amorphous silicon and thus damage on the intrinsic layer 2 inflicted during patterning of the insulating layer 3 can be decreased.

In the heterojunction-type back-contact cell of Embodiment 1, the n-type layer 4 and the p-type layer 5 are both composed of hydrogenated amorphous silicon. Thus, directly joining the n-type layer 4 and the p-type layer 5 does not cause rectification and good ohmic contact can be obtained. Accordingly, in the case where the first electrode 6 is formed on the n-type layer 4 with the p-type layer 5 therebetween, the electrode function can be obtained as in the case of directly forming the first electrode 6 on the n-type layer 4 without using the p-type layer 5.

In Embodiment 1 described above, the end portion 7a of the second electrode 7 is preferably located on the region of the p-type layer 5 where the n-type layer 4 is not present directly below. The conductivity of the p-type layer 5 is smaller than the conductivity of the n-type layer 4 by two to three orders of magnitudes, and it is believed that there is no current that flows in the p-type layer 5 in a horizontal direction (direction perpendicular to the thickness direction of the p-type layer 5). Accordingly, when the end portion 7a of the second electrode 7 is located on the region of the p-type layer 5 where the n-type layer 4 is not present directly below, occurrence of short-circuit current between the first electrode 6 and the second electrode 7 can be effectively decreased and the properties of the heterojunction-type back-contact cell can be improved.

In the description above, the first conductivity type is assumed to be the n-type and the second conductivity type is assumed to be the p-type. Alternatively, the first conductivity type may be assumed to be the p-type and the second conductivity type may be assumed to be the n-type, naturally.

Embodiment 2

Figure 8:
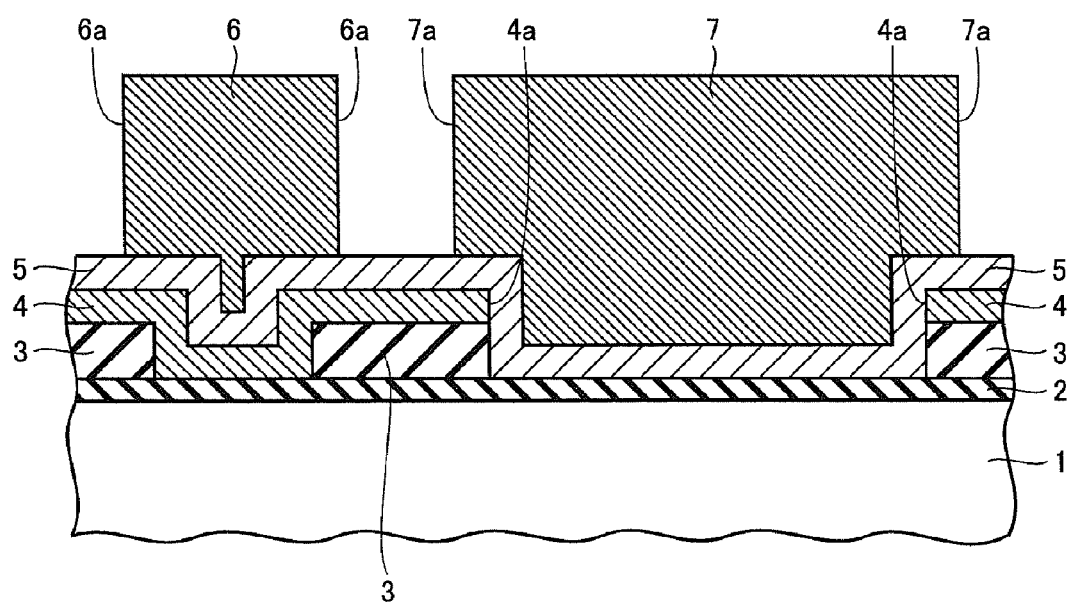
FIG. 8 is a schematic cross-sectional view of a heterojunction-type back-contact cell of Embodiment 2.

FIG. 8 is a schematic cross-sectional view of a heterojunction-type back-contact cell according to Embodiment 2 which is another example of a photoelectric conversion element of the present invention. The heterojunction-type back-contact cell of Embodiment 2 is characterized in that the end portion 4a of the n-type layer 4 is in contact with the p-type layer 5.

An example of a method for manufacturing the heterojunction-type back-contact cell of Embodiment 2 will now be described with reference to schematic cross-sectional views of FIGS. 9 to 11. First, as illustrated in FIGS. 2 to 4, an intrinsic layer 2 and an insulating layer 3 are formed on the back surface of a semiconductor 1 in that order by, for example, a plasma CVD method, a resist 21 having an opening 22 is formed on the back surface of the insulating layer 3, a portion of the insulating layer 3 exposed in the opening 22 is removed, and an n-type layer 4 is formed so as to cover the exposed back surface of the intrinsic layer 2 and the insulating layer 3. The process up to here is the same as in Embodiment 1.

Figure 9:
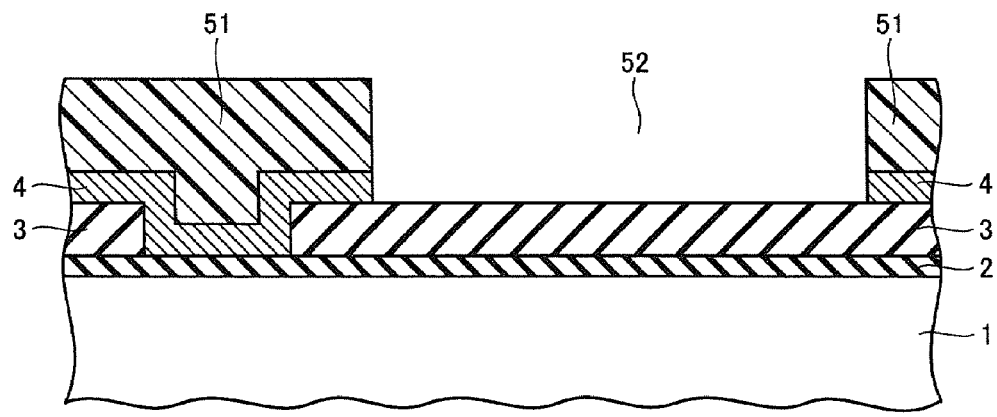
FIG. 9 is a schematic cross-sectional view illustrating an example of a method for manufacturing the heterojunction-type back-contact cell of Embodiment 2.

Next, as illustrated in FIG. 9, a resist 51 having an opening 52 is formed on the back surface of the n-type layer 4 and a portion of the n-type layer 4 exposed in the opening 52 of the resist 51 is removed so as to expose the back surface of the insulating layer 3.

The n-type layer 4 can be removed by, for example, wet etching using an etching solution having a higher etching rate for the n-type layer 4 than the insulating layer 3. An aqueous alkaline solution such as an aqueous tetramethylammonium hydroxide solution, an aqueous potassium hydroxide solution, or an aqueous sodium hydroxide solution can be used as the etching solution, for example. Since the insulating layer 3 composed of silicon nitride and/or silicon oxide remains substantially unetched by the aqueous alkaline solution, the n-type layer 4 can be selectively removed.

Figure 10:
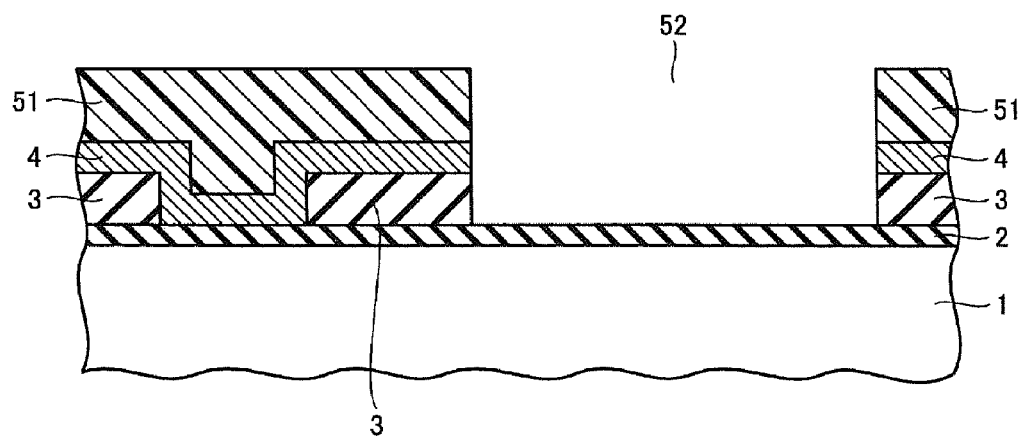
FIG. 10 is a schematic cross-sectional view illustrating an example of a method for manufacturing the heterojunction-type back-contact cell of Embodiment 2.

Next, as illustrated in FIG. 10, a portion of the insulating layer 3 exposed in the opening 52 of the resist 51 is removed to expose the back surface of the intrinsic layer 2.

The insulating layer 3 can be removed by, for example, wet etching using hydrofluoric acid. When the insulating layer 3 is removed by wet etching using hydrofluoric acid, the intrinsic layer 2 composed of i-type hydrogenated amorphous silicon remains substantially intact and thus the insulating layer 3 can be selectively removed.

Figure 11:
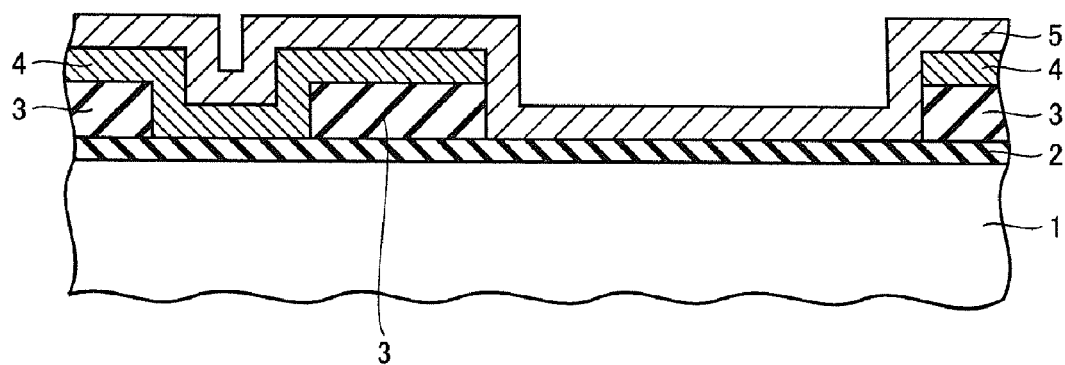
FIG. 11 is a schematic cross-sectional view illustrating an example of a method for manufacturing the heterojunction-type back-contact cell of Embodiment 2.

After the resist 51 is completely removed from the back surface of the n-type layer 4, as illustrated in FIG. 11, a p-type layer 5 is formed by, for example, a plasma CVD method so as to cover the exposed back surface of the intrinsic layer 2 and the back surface of the n-type layer 4.

Next, as illustrated in FIG. 8, a first electrode 6 is formed on the back surface of the n-type layer 4 and a second electrode 7 is formed on the back surface of the p-type layer 5.

The heterojunction-type back-contact cell of Embodiment 2 can be manufactured as described above.

Since features of Embodiment 2 other than those described above are identical to those of Embodiment 1, the description therefor is omitted.

Embodiment 3

Figure 12:
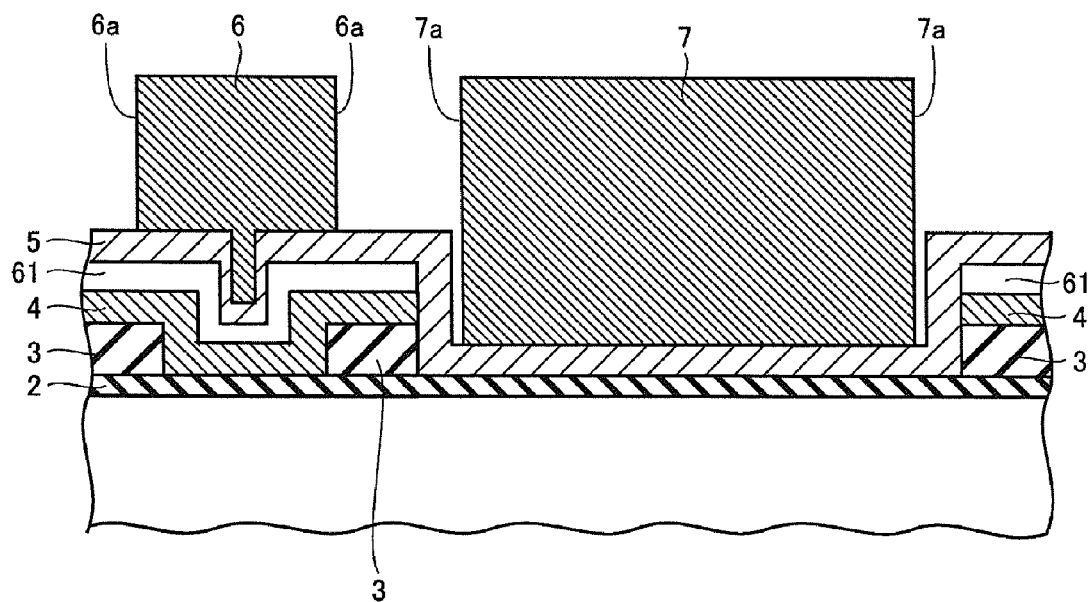
FIG. 12 is a schematic cross-sectional view of a heterojunction-type back-contact cell of Embodiment 3.

FIG. 12 is a schematic cross-sectional view of a heterojunction-type back-contact cell according to Embodiment 3 which is another example of a photoelectric conversion element of the present invention. The heterojunction-type back-contact cell of Embodiment 3 is characterized in that an intermediate layer 61 is disposed between the n-type layer 4 and the p-type layer 5.

An example of a method for manufacturing a heterojunction-type back-contact cell of Embodiment 3 will now be described with reference to schematic cross-sectional view of FIGS. 13 to 15. First, as illustrated in FIGS. 2 to 4, an intrinsic layer 2 and an insulating layer 3 are formed on the back surface of a semiconductor 1 in that order by, for example, a plasma CVD method, a resist 21 having an opening 22 is formed on the back surface of the insulating layer 3, a part of the insulating layer 3 exposed in the opening 22 is removed, and an n-type layer 4 is formed so as to cover the exposed back surface of the intrinsic layer 2 and the insulating layer 3. The process up to here is the same as those in Embodiments 1 and 2.

Figure 13:
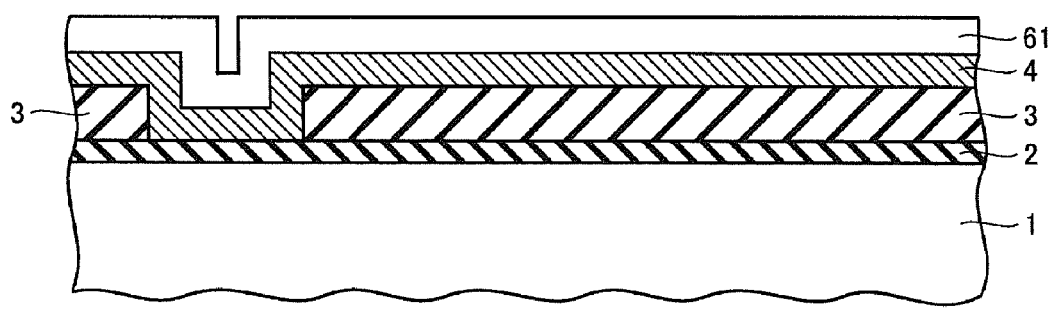
FIG. 13 is a schematic cross-sectional view illustrating an example of a method for manufacturing the heterojunction-type back-contact cell of Embodiment 3.

Next, as illustrated in FIG. 13, an intermediate layer 61 is formed so as to cover the entire back surface of the n-type layer 4. The intermediate layer 61 is preferably composed of a material that has a work function that is intermediate between the work function of the n-type layer 4 and the work function of the p-type layer 5. In such a case, the connection between the n-type layer 4 and the intermediate layer 61 and between the intermediate layer 61 and the p-type layer 5 can be established at low resistance. Examples of the material for the intermediate layer 61 include ITO (indium tin oxide) and ZnO. An intermediate layer 61 composed of ITO or ZnO can be formed by, for example, a sputtering method.

Figure 14:
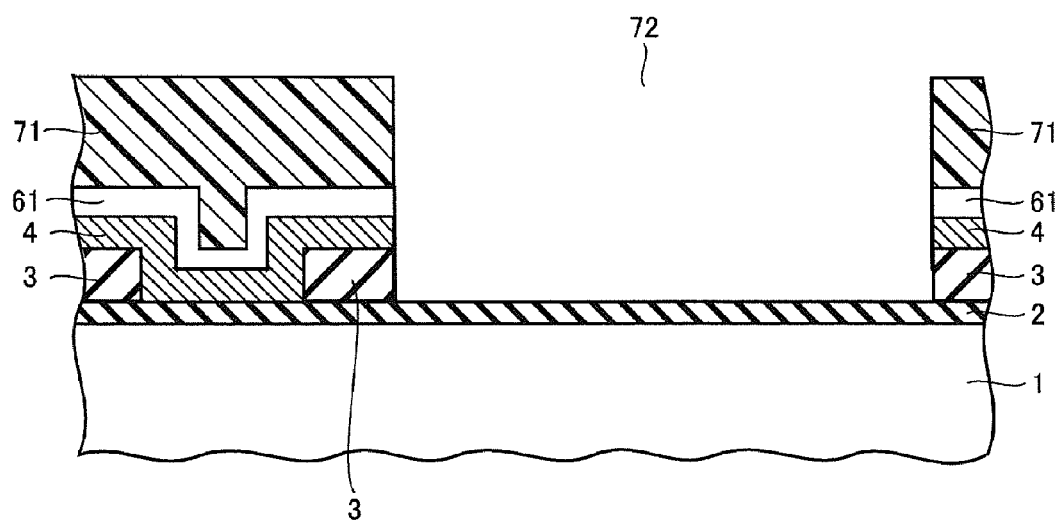
FIG. 14 is a schematic cross-sectional view illustrating an example of a method for manufacturing the heterojunction-type back-contact cell of Embodiment 3.

Next, as illustrated in FIG. 14, a resist 71 having an opening 72 is formed on the back surface of the intermediate layer 61 and portions of the intermediate layer 61, the n-type layer 4, the insulating layer 3 exposed in the opening 72 are removed so as to expose the back surface of the intrinsic layer 2.

The intermediate layer 61 composed of ITO can be removed by, for example, wet etching using hydrochloric acid or the like. In such a case, the n-type layer 4 functions as an etching stop layer.

The n-type layer 4 can be removed by wet etching using an etching solution having an etching rate higher for the n-type layer 4 than for the insulating layer 3. An aqueous alkaline solution such as an aqueous tetramethylammonium hydroxide solution, an aqueous potassium hydroxide solution, or an aqueous sodium hydroxide solution can be used as the etching solution. Since the insulating layer 3 composed of silicon nitride and/or silicon oxide remains substantially unetched by the aqueous alkaline solution, the n-type layer 4 can be selectively removed.

The insulating layer 3 can be removed by, for example, wet etching using hydrofluoric acid. In the case where the insulating layer 3 is removed by wet etching using hydrofluoric acid, the intrinsic layer 2 composed of i-type hydrogenated amorphous silicon remains substantially intact and thus the insulating layer 3 can be selectively removed.

Figure 15:
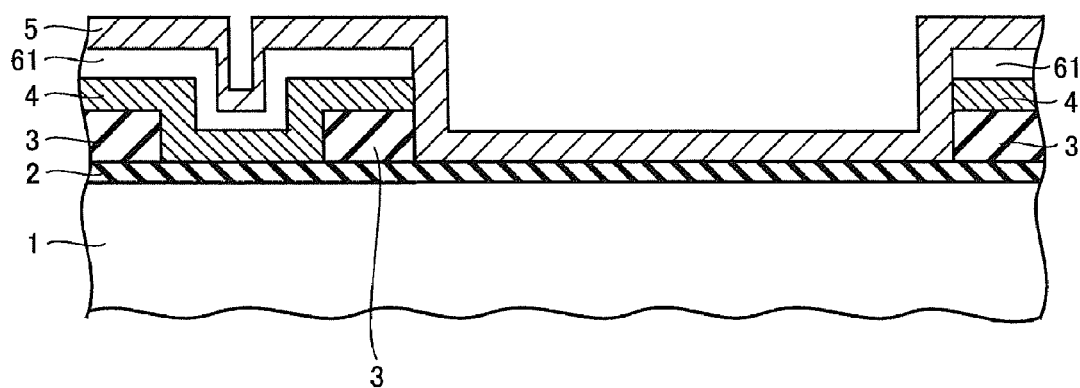
FIG. 15 is a schematic cross-sectional view illustrating an example of a method for manufacturing the heterojunction-type back-contact cell of Embodiment 3.

After the resist 71 is completely removed from the back surface of the intermediate layer 61, as illustrated in FIG. 15, a p-type layer 5 is formed by, for example, a plasma CVD method so as to cover the exposed back surface of the intrinsic layer 2 and the back surface of the intermediate layer 61.

Then, as illustrated in FIG. 12, a first electrode 6 is formed on the back surface of the n-type layer 4 and a second electrode 7 is formed on the back surface of the p-type layer 5. Here, the end portion 6a of the first electrode 6 is preferably located above the intermediate layer 61, and the end portion 7a of the second electrode 7 is preferably not located above the intermediate layer 61. In this case, leak current is effectively prevented from flowing between the first electrode 6 and the second electrode 7 even if the resistance of the intermediate layer 61 in the thickness direction is low. The first electrode 6 and the second electrode 7 may be formed by printing silver paste or forming a metal film such as silver or aluminum or a laminate constituted by a metal oxide conductive film of ITO, ZnO, or the like and a metal film, and then conducting patterning by a photolithographic method or the like.

The heterojunction-type back-contact cell of Embodiment 3 can be manufactured as described above.

Since features of Embodiment 3 other than those described above are identical to those of Embodiments 1 and 2, the description therefor is omitted.

Embodiment 4

Figure 16:
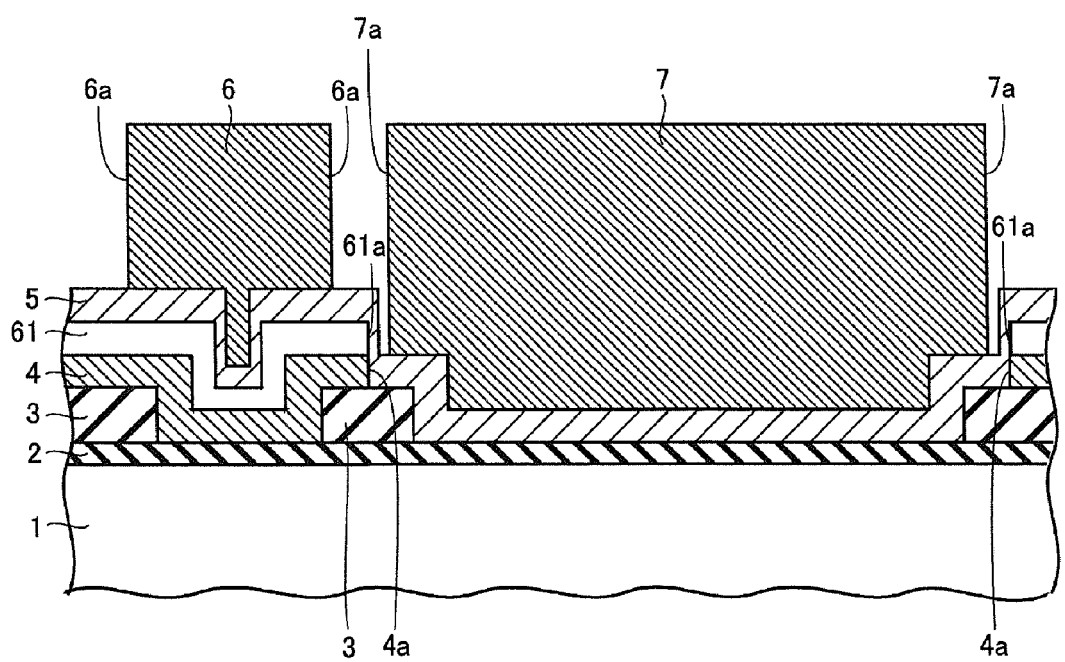
FIG. 16 is a schematic cross-sectional view of a heterojunction-type back-contact cell of Embodiment 4.

FIG. 16 is a schematic cross-sectional view of a heterojunction-type back-contact cell according to Embodiment 4 which is another example of a photoelectric conversion element of the present invention. The heterojunction-type back-contact cell of Embodiment 4 is characterized in that an end portion 61a of the intermediate layer 61 between the n-type layer 4 and the p-type layer 5 is located on the insulating layer 3.

An example of a method for manufacturing a heterojunction-type back-contact cell of Embodiment 4 will now be described with reference to schematic cross-sectional views of FIGS. 17 to 19. First, as illustrated in FIGS. 2 to 4 and 13, an intrinsic layer 2 and an insulating layer 3 are formed in that order by, for example, a plasma CVD method on the back surface of a semiconductor 1, a resist 21 having an opening 22 is formed on the back surface of the insulating layer 3, a portion of the insulating layer 3 exposed in the opening 22 is removed, and an n-type layer 4 and an intermediate layer 61 are formed so as to cover the exposed back surface of the intrinsic layer 2 and the insulating layer 3. The process up to here is the same as that in Embodiment 3.

Figure 17:
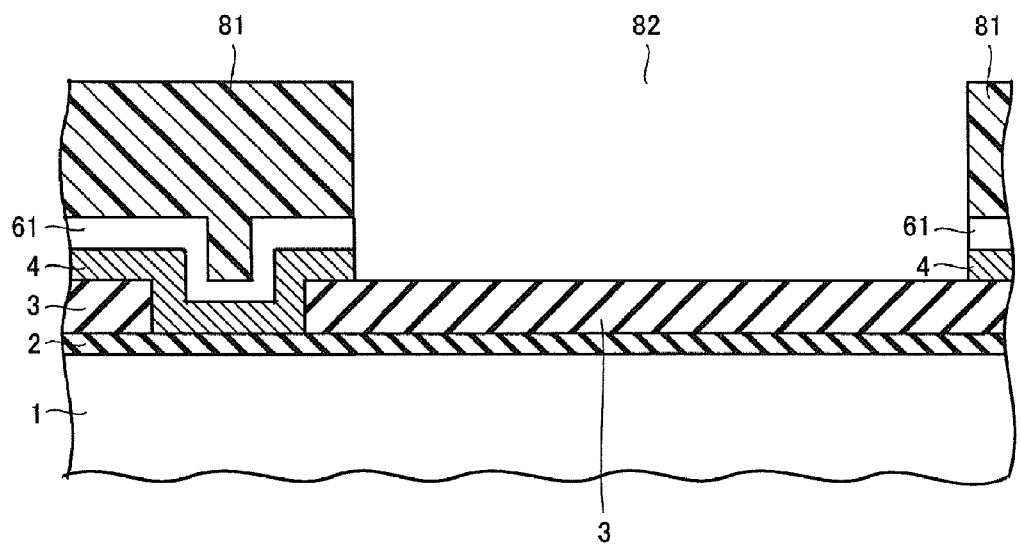
FIG. 17 is a schematic cross-sectional view illustrating an example of a method for manufacturing the heterojunction-type back-contact cell of Embodiment 4.

Next, as illustrated in FIG. 17, a resist 81 having an opening 82 is formed on the back surface of the intermediate layer 61 and portions of the intermediate layer 61 and the n-type layer 4 exposed in the opening 82 are removed to expose the back surface of the insulating layer 3.

For example, the intermediate layer 61 composed of ITO can be removed by wet etching using hydrochloric acid or the like. In such a case, the n-type layer 4 functions as an etching stop layer.

The n-type layer 4 can be removed by wet etching using an etching solution that has an etching rate higher for the n-type layer 4 than for the insulating layer 3, for example. This etching solution may be, for example, an aqueous alkaline solution such as an aqueous tetramethylammonium hydroxide solution, an aqueous potassium hydroxide solution, or an aqueous sodium hydroxide solution. Since the insulating layer 3 composed of silicon nitride and/or silicon oxide remains substantially unetched by the aqueous alkaline solution, the n-type layer 4 can be selectively removed.

Figure 18:
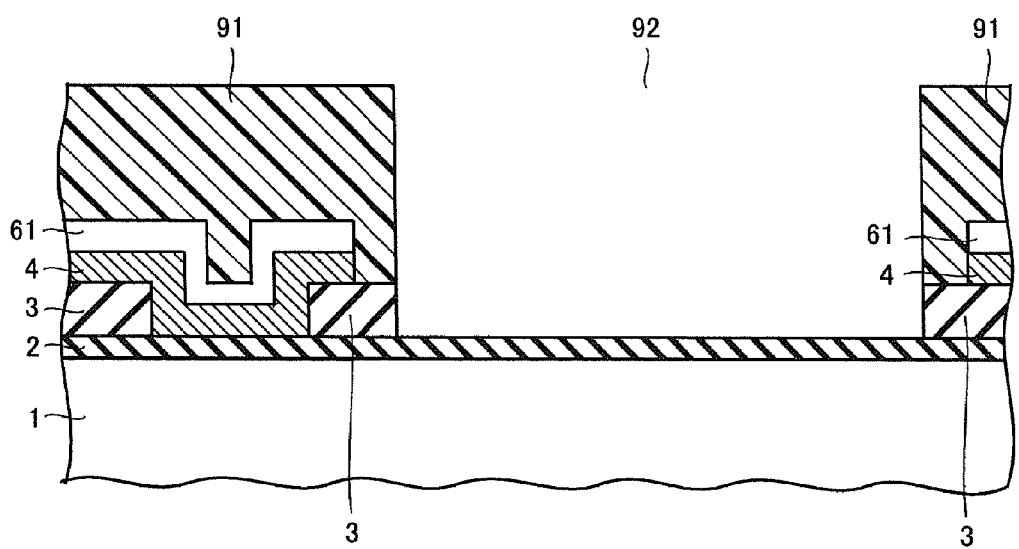
FIG. 18 is a schematic cross-sectional view illustrating an example of a method for manufacturing the heterojunction-type back-contact cell of Embodiment 4.

After the resist 81 is completely removed, as illustrated in FIG. 18, a resist 91 having an opening 92 is formed on the exposed back surface of the insulating layer 3 and the back surface of the intermediate layer 61, and a portion of the insulating layer 3 exposed in the opening 92 is removed so as to expose the back surface of the intrinsic layer 2.

The insulating layer 3 can be removed by, for example, wet etching using hydrofluoric acid. In the case where the insulating layer 3 is removed by wet etching using hydrofluoric acid, the intrinsic layer 2 composed of i-type hydrogenated amorphous silicon remains substantially intact and thus the insulating layer 3 can be selectively removed.

Figure 19:
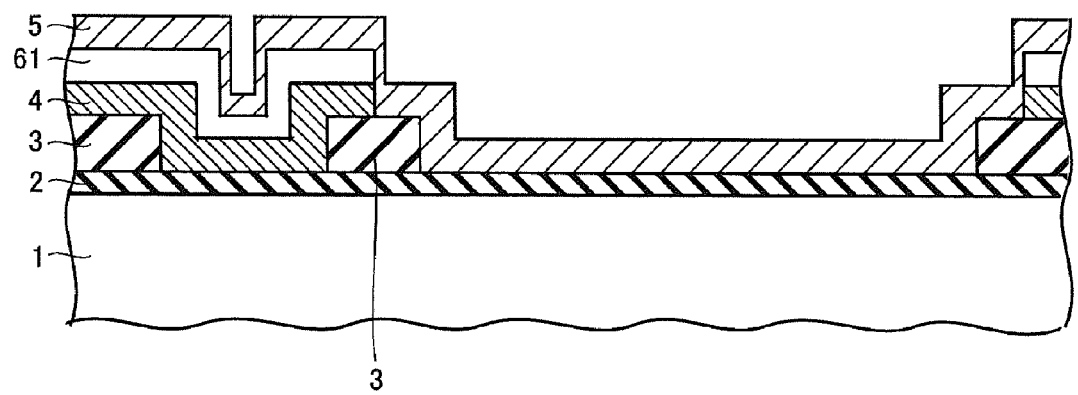
FIG. 19 is a schematic cross-sectional view illustrating an example of a method for manufacturing the heterojunction-type back-contact cell of Embodiment 4.

After the resist 91 is completely removed, as illustrated in FIG. 19, a p-type layer 5 is formed by, for example, a plasma CVD method so as to cover the exposed back surface of the intrinsic layer 2, the back surface of the insulating layer 3, and the back surface of the intermediate layer 61.

Subsequently, as illustrated in FIG. 16, a first electrode 6 is formed on the back surface of the n-type layer 4 and a second electrode 7 is formed on the back surface of the p-type layer 5.

The heterojunction-type back-contact cell of Embodiment 4 can be manufactured as described above.

In the heterojunction-type back-contact cell of Embodiment 4, since the end portion 61a of the intermediate layer 61 is located on the insulating layer 3, a current path in a direction horizontal to the p-type layer 5 (in a direction perpendicular to the thickness direction of the p-type layer 5) is included in the current path between the intermediate layer 61 and the p-type layer 5/intrinsic layer 2 interface among the current path that does not include the semiconductor 1. Thus, occurrence of leak current between the first electrode 6 and the second electrode 7 can be decreased. A method for forming the end portion 61*a* of the intermediate layer 61 to be located on the insulating layer 3 is, for example, over-etching the intermediate layer 61 in a horizontal direction in the step illustrated in FIG. 14 of Embodiment 3, for example.

In the heterojunction-type back-contact cell of Embodiment 4, since the end portion 4*a* of the n-type layer 4 is located on the insulating layer 3, a current path in a direction horizontal to the p-type layer 5 (in a direction perpendicular to the thickness direction of the p-type layer 5) is included in the current path between the n-type layer 4 and the p-type layer 5/intrinsic layer 2 interface among the current path that does not include the semiconductor 1. Thus, occurrence of leak current between the first electrode 6 and the second electrode 7 can be decreased. A method for forming the end portion 4*a* of the n-type layer 4 to be located on the insulating layer 3 is, for example, over-etching the n-type layer 4 in a horizontal direction in the step illustrated in FIG. 14 of Embodiment 3, for example.

In the heterojunction-type back-contact cell of Embodiment 4, the end portion 7*a* of the second electrode 7 is preferably located on the insulating layer 3. In such a case, the semiconductor 1 and the intrinsic layer 2 are less damaged during patterning of the second electrode 7.

Since features of Embodiment 4 other than those described above are identical to those of Embodiments 1 to 3, the description therefor is omitted.

Described below are other aspects of the present invention, namely, a photoelectric conversion module (Embodiment 5) and solar power generation systems (Embodiments 6 and 7) equipped with the heterojunction-type back-contact cells of Embodiments 1 to 4.

Since the heterojunction-type back-contact cells of Embodiments 1 to 4 have enhanced properties, the photoelectric conversion module and the solar power generation systems equipped with the heterojunction-type back-contact cells also have enhanced properties.

Embodiment 5

Embodiment 5 is a photoelectric conversion module that uses the heterojunction-type back-contact cells of Embodiments 1 to 4 as photoelectric conversion elements.
<Photoelectric Conversion Module>

Figure 22:
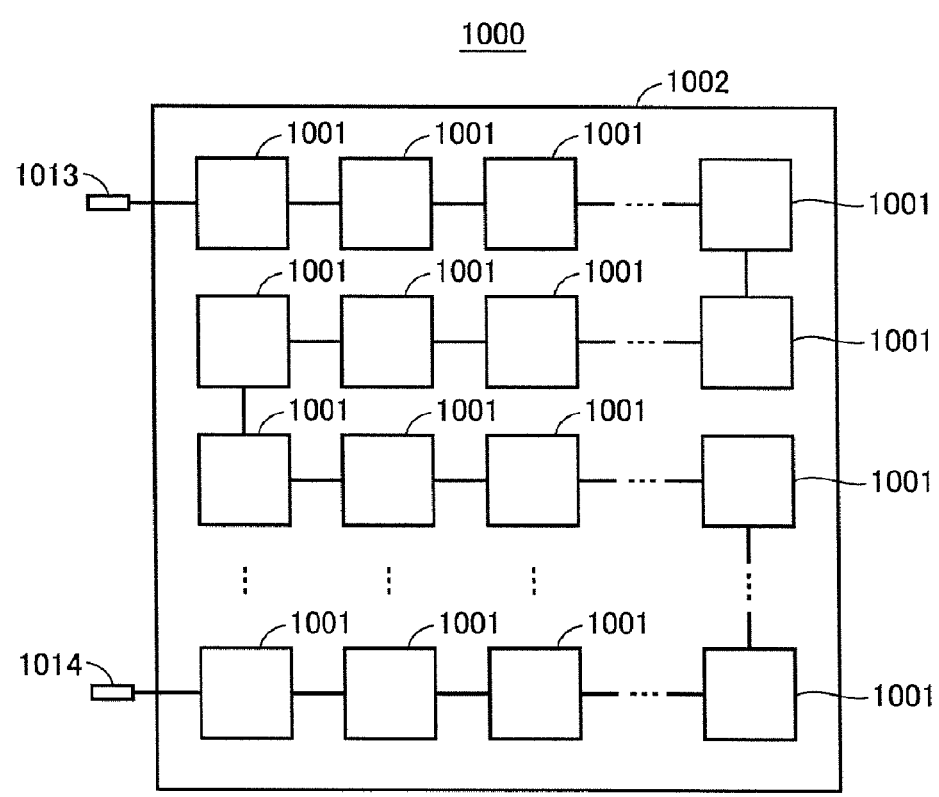
FIG. 22 is a schematic diagram of a structure of a photoelectric conversion module of Embodiment 5.

FIG. 22 is a schematic diagram illustrating a structure of a photoelectric conversion module according to Embodiment 5 which is an example of a photoelectric conversion module of the present invention that uses heterojunction-type back-contact cells of Embodiments 1 to 4 as photoelectric conversion elements. Referring to FIG. 22, a photoelectric conversion module 1000 of Embodiment 5 includes plural photoelectric conversion elements 1001, a cover 1002, and output terminals 1013 and 1014.

The photoelectric conversion elements 1001 are arranged into an array and connected in series. FIG. 22 illustrates an arrangement in which the photoelectric conversion elements 1001 are connected in series but the arrangement and the connection mode are not limited to these. The elements may be connected in parallel or both in series and in parallel. The photoelectric conversion elements 1001 are each one of the heterojunction-type back-contact cells of Embodiments 1 to 4. The photoelectric conversion module 1000 is not limited by the description above and may take any structure as long as at least one of the photoelectric conversion element 1001 is any one of the photoelectric conversion elements of Embodiments 1 to 4. The number of photoelectric conversion elements 1001 included in the photoelectric conversion module 1000 can be any integer equal to or greater than 2.

The cover 1002 is formed of a weatherproof cover and covers the photoelectric conversion elements 1001.

The output terminal 1013 is connected to the photoelectric conversion element 1001 arranged at one end of the photoelectric conversion elements 1001 connected in series.

The output terminal 1014 is connected to the photoelectric conversion element 1001 arranged at the other end of the photoelectric conversion element 1001 connected in series.

Embodiment 6

Embodiment 6 is a solar power generation system that uses heterojunction-type back-contact cells of Embodiments 1 to 4 as photoelectric conversion elements. Since the photoelectric conversion elements of the present invention have enhanced properties (conversion efficiency etc.), the solar power generation system of the present invention equipped with such elements can also have enhanced properties. A solar power generation system is an apparatus that appropriately converts power output from the photoelectric conversion modules and supplies power to a commercial power network or an electrical appliance etc.
<Solar Power Generation System>

A solar power generation system is an apparatus that appropriately converts power output from the photoelectric conversion modules and supplies power to a commercial power network or an electrical appliance etc.

Figure 23:
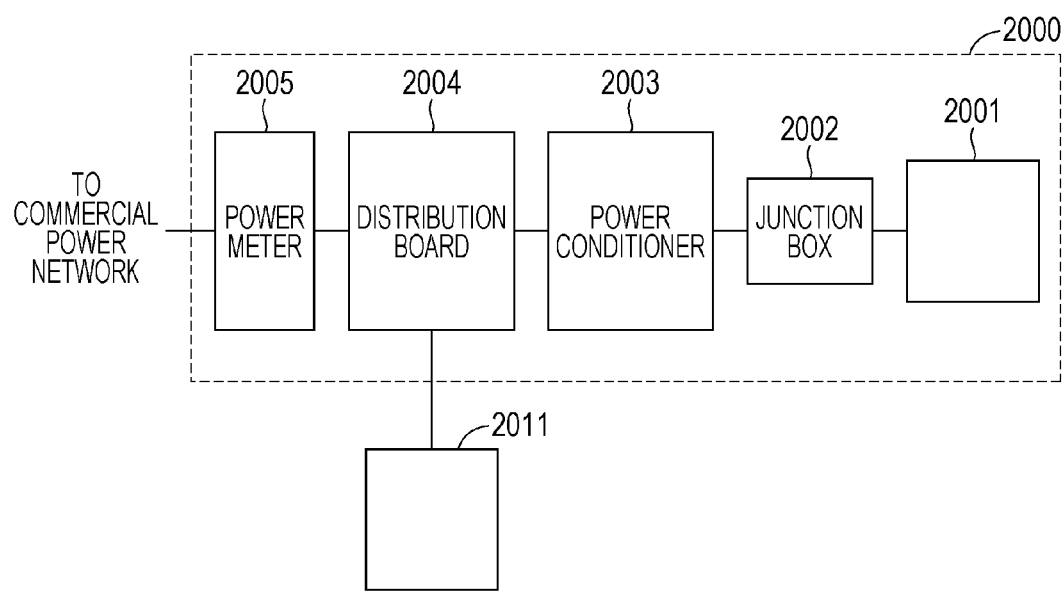
FIG. 23 is a schematic diagram of a structure of a solar power generation system of Embodiment 6.

FIG. 23 is a schematic diagram illustrating a structure of a solar power generation system of Embodiment 6 which is an example of a solar power generation system of the present invention in which heterojunction-type back-contact cells of Embodiments 1 to 4 are used as photoelectric conversion elements. Referring to FIG. 23, a solar power generation system 2000 of Embodiment 6 includes a photoelectric conversion module array 2001, a junction box 2002, a power conditioner 2003, a distribution board 2004, and a power meter 2005. As described below, the photoelectric conversion module array 2001 is constituted by plural photoelectric conversion modules 1000 (Embodiment 5).

In general, a function known as a "home energy management system (HEMS)", a "building energy management system (BEMS)", or the like can be added to the solar power generation system 2000. As a result, the amount of power generated by the solar power generation system 2000 can be monitored, the amount of power consumed by electric appliances connected to the solar power generation system 2000 can be monitored and controlled, and thus the energy consumption can be cut down.

The junction box 2002 is connected to the photoelectric conversion module array 2001. The power conditioner 2003 is connected to the junction box 2002. The distribution board 2004 is connected to the power conditioner 2003 and an electrical appliance 2011. The power meter 2005 is connected to the distribution board 2004 and to a commercial power network. Note that a storage battery may be connected to the power conditioner 2003. In such a case, output fluctuation caused by fluctuation in amount of sunlight can be decreased and the power stored in the storage battery can be supplied even in the time zone where sunshine is not available. The storage battery may be built inside the power conditioner 2003.

<Operation>

The operation of the solar power generation system 2000 of Embodiment 6 is, for example, as follows.

The photoelectric conversion module array 2001 converts sunlight into electricity to generate DC power and supplies DC power to the junction box 2002.

The junction box 2002 receiving the DC power generated by the photoelectric conversion module array 2001 supplies the DC power to the power conditioner 2003.

The power conditioner 2003 converts DC power supplied from the junction box 2002 into AC power and supplies AC power to the distribution board 2004. Here, part of the DC power supplied from the junction box 2002 may remain unconverted and be supplied to the distribution board 2004 as is. Note that in the case where a storage battery is connected to the power conditioner 2003 (or a storage battery is built inside the power conditioner 2003), the power conditioner 2003 converts all or part of the DC power supplied from the junction box 2002 into an appropriate form of power so that the power can be stored in the storage battery. The power stored in the storage battery is supplied to the power conditioner 2003 side as needed depending on the amount of power generated by the photoelectric conversion module or the status of power consumption of the electrical appliance 2011, converted into an appropriate form of power, and supplied to the distribution board 2004.

The distribution board 2004 supplies to the electrical appliance 2011 at least one of the AC power supplied from the power conditioner 2003 and the commercial power supplied through the power meter 2005. If the AC power supplied from the power conditioner 2003 is larger than the power consumed by the electrical appliance 2011, the distribution board 2004 supplies to the electrical appliance 2011 the AC power supplied from the power conditioner 2003. The excess AC power is supplied to the commercial power network through the power meter 2005.

When the AC power supplied to the distribution board 2004 from the power conditioner 2003 is smaller than the power consumed by the electrical appliance 2011, the distribution board 2004 supplies to the electrical appliance 2011 AC power supplied from the commercial power network and AC power supplied from the power conditioner 2003.

The power meter 2005 measures the power that flows from the commercial power network to the distribution board 2004 and the power that flows from the distribution board 2004 to the commercial power network.

<Photoelectric Conversion Module Array>

The photoelectric conversion module array 2001 will now be described.

Figure 24:
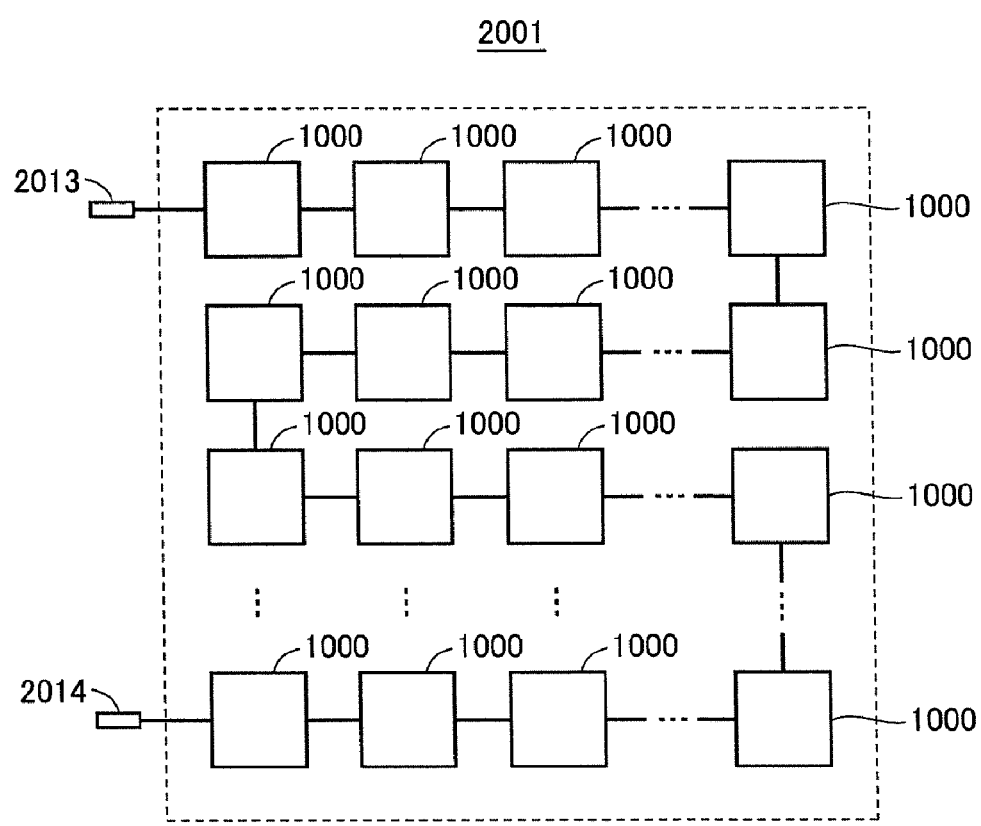
FIG. 24 is a schematic diagram illustrating an example of a structure of the photoelectric conversion module array illustrated in FIG. 23.

FIG. 24 is a schematic diagram illustrating an example of a structure of the photoelectric conversion module array 2001 illustrated in FIG. 23. Referring to FIG. 24, the photoelectric conversion module array 2001 includes plural photoelectric conversion modules 1000 and output terminals 2013 and 2014.

The photoelectric conversion modules 1000 are arranged into an array and connected in series. FIG. 24 illustrates an arrangement in which the photoelectric conversion modules 1000 are connected in series but the arrangement and the connection mode are not limited to these. The modules may be connected in parallel or both in series and in parallel. The number of the photoelectric conversion modules 1000 included in the photoelectric conversion module array 2001 can be any integer equal to or greater than 2.

The output terminal 2013 is connected to the photoelectric conversion module 1000 located at one end of the photoelectric conversion modules 1000 connected in series.

The output terminal 2014 is connected to the photoelectric conversion module 1000 located at the other end of the photoelectric conversion modules 1000 connected in series.

The description above is merely exemplary and the solar power generation system of Embodiment 6 may have any structure not limited by the description above as long as at least one of heterojunction-type back-contact cells of Embodiments 1 to 4 is included.

Embodiment 7

Embodiment 7 is a solar power generation system whose scale is larger than that of the solar power generation system described in Embodiment 6. The solar power generation system of Embodiment 7 also includes at least one of heterojunction-type back-contact cells of Embodiments 1 to 4. Since the photoelectric conversion elements of the present invention have enhanced properties (conversion efficiency etc.), the solar power generation system of the present invention equipped with such elements can also have enhanced properties.

<Large-Scale Solar Power Generation System>

Figure 25:
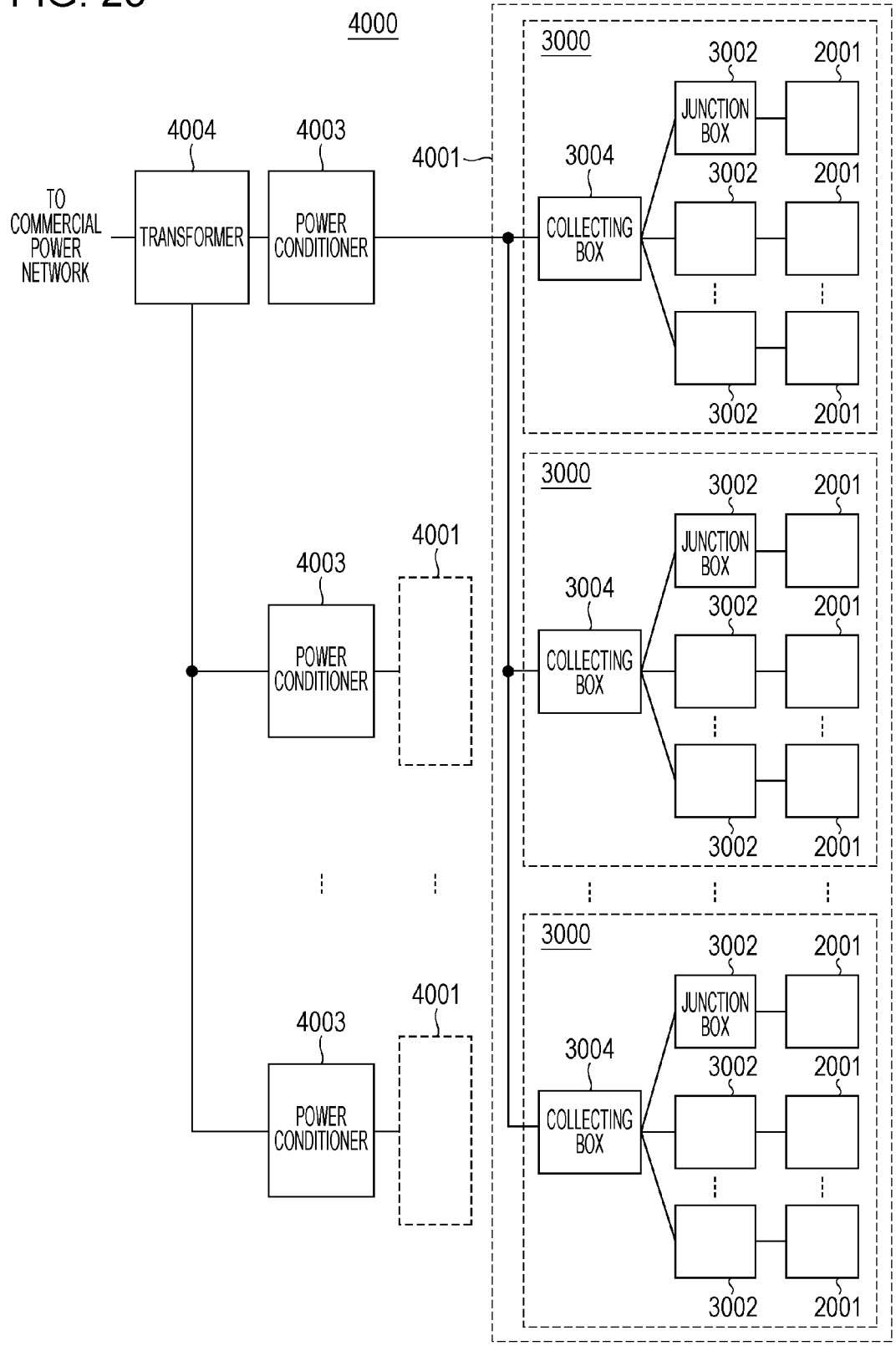
FIG. 25 is a schematic diagram of structure of a solar power generation system of Embodiment 7.

FIG. 25 is a schematic diagram illustrating a structure of a solar power generation system of Embodiment 7 which is an example of a large-scale solar power generation system of the present invention. Referring to FIG. 25, a solar power generation system 4000 of Embodiment 7 includes plural subsystems 4001, plural power conditioners 4003, and a transformer 4004. The scale of the solar power generation system 4000 is larger than the scale of the solar power generation system 2000 of Embodiment 6 illustrated in FIG. 24.

The power conditioners 4003 are respectively connected to the subsystems 4001. In the solar power generation system 4000, the number of power conditioners 4003 and the number of subsystems 4001 connected to the power conditioners 4003 may each be any integer equal to or greater than 2. Note that a storage battery may be connected to the power conditioner 4003. In such a case, output fluctuation caused by fluctuation in amount of sunlight can be decreased and the power stored in the storage battery can be supplied even in the time zone where sunshine is not available. The storage battery may be built inside the power conditioner 4003.

The transformer 4004 is connected to the power conditioners 4003 and the commercial power network.

Each of the subsystems 4001 is constituted by plural module systems 3000. The number of module systems 3000 in each subsystem 4001 may be any integer equal to or greater than 2.

Each of the module systems 3000 includes plural photoelectric conversion module arrays 2001, plural junction boxes 3002, and a collecting box 3004. The number of the junction boxes 3002 and the number of photoelectric conversion module arrays 2001 connected to the junction boxes 3002 in the module system 3000 may be any integer equal to or greater than 2.

The collecting box 3004 is connected to the junction boxes 3002. The power conditioner 4003 is connected to the collecting boxes 3004 in the subsystems 4001.

<Operation>

The operation of the solar power generation system 4000 of Embodiment 7 is, for example, as follows.

The photoelectric conversion module arrays 2001 in the module system 3000 convert sunlight into electricity to generate DC power and supply the DC power to the collecting box 3004 via the junction boxes 3002. The collecting boxes 3004 in the subsystem 4001 supply DC power to the power conditioner 4003. The power conditioners 4003 convert the DC power into AC power and supply AC power to the transformer 4004. Note that in the case where a storage battery is connected to the power conditioner 4003 (or a storage battery is built inside the power conditioner 4003), the power conditioner 4003 converts all or part of the DC power supplied from the collecting box 3004 into an appropriate form of power so that the power can be stored in the storage battery. The power stored in the storage battery is supplied to the power conditioner 4003 side as needed depending on the amount of power generated by the subsystem 4001, converted into an appropriate form of power, and supplied to the transformer 4004.

The transformer 4004 converts the voltage level of the AC power supplied from the power conditioners 4003 and supplies power to the commercial power network.

The solar power generation system 4000 needs to include at least one of the heterojunction-type back-contact cells of Embodiments 1 to 4 and not all of the photoelectric conversion elements in the solar power generation system 4000 need to be the heterojunction-type back-contact cells of Embodiments 1 to 4. For example, it is possible that all of the photoelectric conversion elements in a particular subsystem 4001 are heterojunction-type back-contact cells of Embodiments 1 to 4 while some or all of the photoelectric conversion elements in another subsystem 4001 are not heterojunction-type back-contact cells of Embodiments 1 to 4.

EXAMPLE

Figure 20:
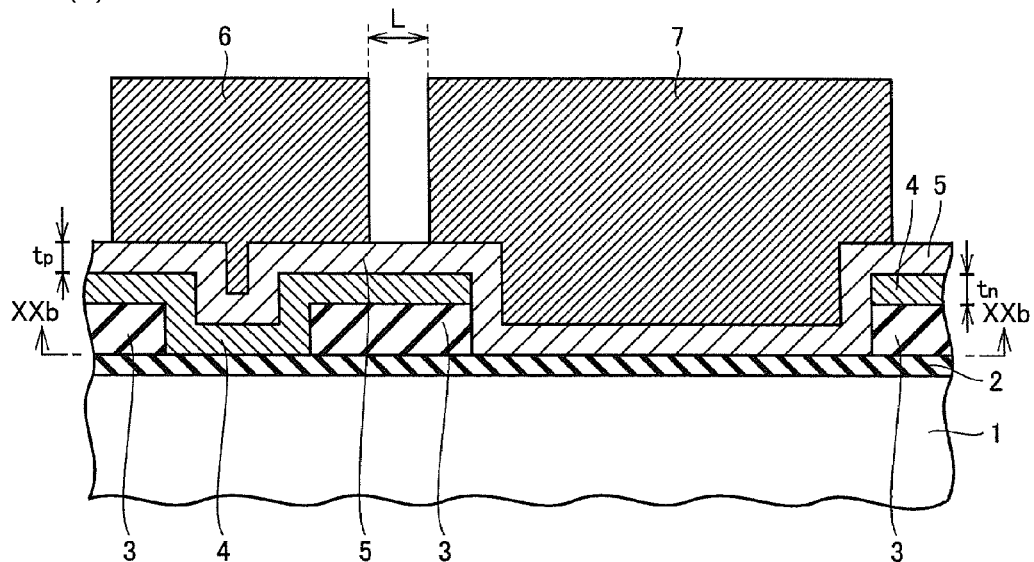
FIG. 20(a) is a schematic cross-sectional view of a heterojunction-type back-contact cell of Example and FIG. 20(b) is a schematic cross-sectional view taken along XXb-XXb in FIG. 20(a).
Figure 20:
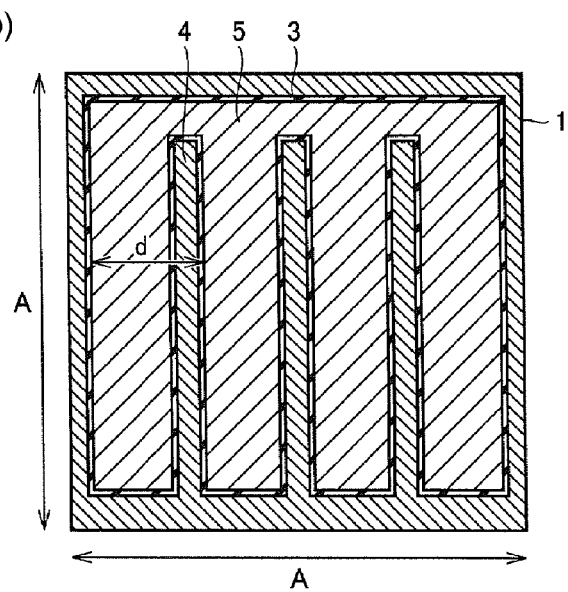
Figure 21:
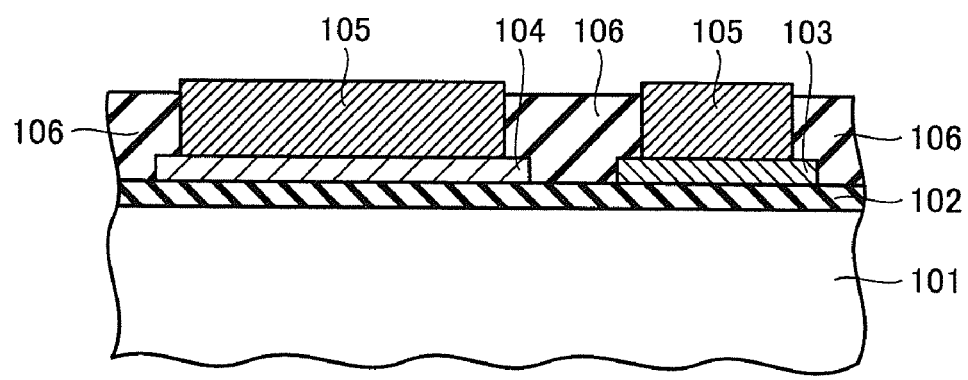
FIG. 21 is a schematic cross-sectional view of an amorphous/crystalline silicon heterojunction device described in PTL 1.

FIG. 20(a) illustrates a cross-sectional structure of a heterojunction-type back-contact cell of Example and FIG. 20(b) is a schematic cross-sectional view taken along XXb-XXb in FIG. 20(a). Note that in FIG. 20(a), L represents the interelectrode distance between the first electrode 6 and the second electrode 7, $t_n$ represents the thickness of the n-type layer 4, and $t_p$ represents the thickness of the p-type layer 5. In FIG. 20(b), A represents the length of one side of the heterojunction-type back-contact cell of Example in plan and d represents the electrode pitch.

The interelectrode leak current $I_{leak}$ satisfies the relationship of formula (I) below with respect to operation voltage $V_{op}$, resistance R, operation current $I_{op}$, and allowable rate α for interelectrode leak current:

[Math. 1]

$$I_{leak} = \frac{V_{op}}{R} \leq I_{op}\alpha \quad \text{(I)}$$

The resistance R satisfies the relationship of formula (II) below with respect to the interelectrode distance L, the conductivity $\sigma_n$ of the n-type layer 4, the thickness $t_n$ of the n-type layer 4, the conductivity $\sigma_p$ of the p-type layer 5, the thickness $t_p$ of the p-type layer 5, the length A of one side of the cell in plan, and the electrode pitch d:

[Math. 2]

$$R \approx \frac{L}{(\sigma_n t_n + \sigma_p t_p)\{2A(A/d) + 2A\}} = \frac{L}{2A(A/d+1)(\sigma_n t_n + \sigma_p t_p)} \quad \text{(II)}$$

It is derived from formula (I) and formula (II) that the interelectrode distance L between the first electrode 6 and the second electrode 7 satisfies the relationship of formula (III) below:

[Math. 3]

$$L \geq \frac{2A(A/d+1)(\sigma_n t_n + \sigma_p t_p)V_{op}}{\alpha I_{op}} \quad \text{(III)}$$

Accordingly, for example, when $t_n$=10 nm, $t_p$=10 nm, $V_{op}$=0.7 V, $I_{op}/A^2$=40 mA/cm², α=0.01, A=10 cm, d=1 mm, $\sigma_n$=1×10⁻² S/cm, and $\sigma_p$=1×10⁻⁴ S/cm, formula (III) finds that the interelectrode distance L needs to satisfy the relationship L≥3.57 μm.

In the case where the p-type layer 5 and the n-type layer 4 are exchanged, formula (III) finds that the interelectrode distance L needs to satisfy the relationship L≥3.57 μm.

It is derived from formula (III) that the conductivity $\sigma_n$ of the n-type layer 4, the thickness $t_n$ of the n-type layer 4, the conductivity $\sigma_p$ of the p-type layer 5, and the thickness $t_p$ of the p-type layer 5 satisfy the relationship of formula (IV) below:

[Math. 4]

$$(\sigma_n t_n + \sigma_p t_p) \leq \frac{\alpha I_{op} L}{2A(A/d+1)V_{op}} \quad \text{(IV)}$$

Accordingly, when $t_n$=10 nm, $t_p$=10 nm, $V_{op}$=0.7 V, $I_{op}/A^2$=40 mA/cm², α=0.01, A=10 cm, and d=1 mm, formula (IV) finds that the conductivity of $\sigma_n$ the n-type layer 4 and the conductivity $\sigma_p$ of the p-type layer 5 need to satisfy the relationship $\sigma_n + \sigma_p \leq 2.8 \times 10^{-2}$ S/cm in order to satisfy L≤10 μm. Since usually $\sigma_n \gg \sigma_p$, the relationship $\sigma_n \leq 2.8 \times 10^{-2}$ S/cm needs to be satisfied. The same applies to the case where the p-type layer 5 and the n-type layer 4 are exchanged.

While embodiments and examples of the present invention have been described above, appropriately combining the features of the embodiments and examples described above is also anticipated from the beginning.

The embodiments and examples disclosed herein are merely illustrative in all aspects and should not be considered as limiting. The scope of the present invention is to be defined not by the description above but by the claims and is intended to cover all modifications within the scope of the claims and equivalents thereof.

INDUSTRIAL APPLICABILITY

The present invention is applicable to photoelectric conversion elements and methods for manufacturing photoelectric conversion elements, in particular, to a heterojunction-type back-contact cell and a method for manufacturing a heterojunction-type back-contact cell.

REFERENCE SIGNS LIST 1 semiconductor
2 intrinsic layer
3 insulating layer
4 n-type layer
4a end portion
4b groove portion
4c flap portion
5 p-type layer
6 first electrode
6a end portion
7 second electrode
7a end portion
8, 9, 10 region
21 resist
22 opening
31 resist
32 opening
41 resist
42 opening
51 resist
52 opening
61 intermediate layer
61a end portion
71 resist
72 opening
81 resist
82 opening
91 resist
92 opening
101 crystalline silicon wafer
102 intrinsic hydrogenated amorphous silicon transition layer
103 n-doped region
104 p-doped region
105 electrode
106 reflection layer
1000 photoelectric conversion module
1001 photoelectric conversion element
1002 cover
1013, 1014 output terminal
2000 solar power generation system
2001 photoelectric conversion module array
2002 junction box
2003 power conditioner
2004 distribution board
2005 power meter
2011 electrical appliance
2013, 2014 output terminal
3000 module system
3002 junction box
3004 collecting box
4000 solar power generation system
4001 subsystem
4003 power conditioner
4004 transformer

The invention claimed is:

1. A photoelectric conversion element comprising:
a semiconductor of a first conductivity type;
an intrinsic layer on the semiconductor and including hydrogenated amorphous silicon;
a first-conductivity-type layer that covers a portion of the intrinsic layer and includes hydrogenated amorphous silicon of the first conductivity type;
a second-conductivity-type layer that covers a portion of the intrinsic layer and includes hydrogenated amorphous silicon of a second conductivity type;
an insulating layer that directly covers a portion of the intrinsic layer while directly contacting an end portion of the first-conductivity-type layer;
a first electrode that covers at least a portion of the first-conductivity-type layer; and
a second electrode on the second-conductivity-type layer, wherein
at least a portion of the first electrode is directly on a portion of a surface of the second-conductivity-type layer, under which the second-conductivity type layer directly contacts the end portion of the first-conductivity-type layer,
at least a portion of the first electrode is above a region where the first-conductivity-type layer contacts the intrinsic layer, and
at least a portion of the second electrode is above a region where the second-conductivity-type layer contacts the intrinsic layer.

2. The photoelectric conversion element according to claim 1, wherein, in a region other than the region where the second-conductivity-type layer contacts the intrinsic layer, the second-conductivity-type layer is located so as to cover the intrinsic layer with at least one of the first-conductivity-type layer and the insulating layer therebetween.

3. The photoelectric conversion element according to claim 1, wherein an end portion of the first electrode and an end portion of the second electrode are located above the insulating layer.

4. The photoelectric conversion element according to claim 1, wherein the second conductivity type is a p-type.

5. A photoelectric conversion module comprising:
a plurality of photoelectric conversion elements arranged in an array, connected in series, in parallel, or both in series and in parallel, and including two or more of the photoelectric conversion element according to claim 1,
a cover that covers the two or more photoelectric conversion elements and includes a transparent substrate on a light-receiving side and a back-side substrate on a back side opposite to the light-receiving side,
a sealing member filling in a gap between the transparent substrate and the back-side substrate,
a first terminal connected to one end of the array, and
a second terminal connected to the other end of the array.

6. A solar power generation system comprising:
the photoelectric conversion module according to claim 5.

7. A solar power generation system comprising:
the photoelectric conversion element according to claim 1.

8. A photoelectric conversion element comprising:
a semiconductor of a first conductivity type;
an intrinsic layer on the semiconductor and including hydrogenated amorphous silicon;
a first-conductivity-type layer that covers a portion of the intrinsic layer and includes hydrogenated amorphous silicon of the first conductivity type;
a second-conductivity-type layer that covers a portion of the intrinsic layer and includes hydrogenated amorphous silicon of a second conductivity type;
an insulating layer that directly covers a portion of the intrinsic layer while directly contacting an end portion of the first-conductivity-type layer;
a first electrode on the second-conductivity-type layer; and a second electrode on the second-conductivity-type layer, wherein
at least a portion of the first electrode is directly on a portion of a surface of the second-conductivity-type layer, under which the second-conductivity type layer directly contacts the end portion of the first-conductivity-type layer.

9. The photoelectric conversion element according to claim 8, wherein in a region other than a region where the second-conductivity-type layer contacts the intrinsic layer, the second-conductivity-type layer covers the intrinsic layer with at least one of the first-conductivity-type layer and the insulating layer therebetween.

10. The photoelectric conversion element according to claim 8, wherein an end portion of the first electrode and an end portion of the second electrode are above the insulating layer.

11. The photoelectric conversion element according to claim 8, wherein the second conductivity type is a p-type.

12. A photoelectric conversion module comprising:
a plurality of photoelectric conversion elements arranged in an array, connected in series, in parallel, or both in series and in parallel, and including two or more of the photoelectric conversion element according to claim 8;
a cover that covers the two or more photoelectric conversion elements and includes a transparent substrate on a light-receiving side and a back-side substrate on a back side opposite to the light-receiving side;
a sealing member filling in a gap between the transparent substrate and the back-side substrate;
a first terminal connected to one end of the array; and
a second terminal connected to the other end of the array.

13. A solar power generation system comprising:
the photoelectric conversion module according to claim 12.

14. A solar power generation system comprising:
the photoelectric conversion element according to claim 8.

* * * * *